US012676179B2

(12) United States Patent
Murayama et al.

(10) Patent No.: US 12,676,179 B2
(45) Date of Patent: Jul. 7, 2026

(54) SEMICONDUCTOR DEVICE HAVING ROW DECODER CIRCUIT

(71) Applicant: MICRON TECHNOLOGY, INC., Boise, ID (US)

(72) Inventors: Katsunari Murayama, Sagamihara (JP); Mamoru Nishizaki, Yokohama (JP); Manami Mizukane, Sagamihara (JP); Hidekazu Noguchi, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 114 days.

(21) Appl. No.: 18/749,394

(22) Filed: Jun. 20, 2024

(65) Prior Publication Data

US 2025/0037754 A1       Jan. 30, 2025

Related U.S. Application Data

(60) Provisional application No. 63/515,568, filed on Jul. 25, 2023.

(51) Int. Cl.
*G11C 11/408*      (2006.01)
*G11C 11/4091*     (2006.01)
*G11C 11/4094*     (2006.01)

(52) U.S. Cl.
CPC ...... *G11C 11/4085* (2013.01); *G11C 11/4087* (2013.01); *G11C 11/4091* (2013.01); *G11C 11/4094* (2013.01)

(58) Field of Classification Search
CPC ......................... G11C 11/4085; G11C 11/4087
USPC ........................................................ 365/149
See application file for complete search history.

(56) References Cited

U.S. PATENT DOCUMENTS

2006/0044924 A1*   3/2006   Wada ................... G11C 11/4074
                                                         365/230.06
2016/0155484 A1*   6/2016   Lin .......................... G11C 8/08
                                                         365/230.03
2022/0093158 A1*   3/2022   Lee ........................ H10D 64/27

* cited by examiner

*Primary Examiner* — Anthan Tran
(74) *Attorney, Agent, or Firm* — Dorsey & Whitney LLP

(57) ABSTRACT

An example apparatus includes first and second memory cell arrays arranged in a first direction; and a plurality of first and second sub word line drivers, a plurality of main word line drivers, and a plurality of level shift circuits each arranged on an intermediate region between the first and second memory cell arrays. The first and second sub word line drivers are arranged in a second direction and along the first and second memory cell array, respectively. The main word line drivers are arranged in the second direction and adjacently along the plurality of second sub word line drivers. The level shift circuits are arranged in the second direction and adjacently along the plurality of first sub word line drivers. The level shift circuits are configured to provide voltage-level-shifted signals to the plurality of main word line drivers, respectively.

14 Claims, 8 Drawing Sheets

SEMICONDUCTOR DEVICE HAVING ROW DECODER CIRCUIT

CROSS REFERENCE TO RELATED APPLICATION(S)

This application claims the benefit under 35 U.S.C. § 119 of the earlier filing date of U.S. Provisional Application Ser. No. 63/515,568 filed Jul. 25, 2023, the entire contents of which are hereby incorporated by reference in its entirety for any purpose.

BACKGROUND

There is a case where a semiconductor memory device such as a DRAM (Dynamic Random Access Memory) has a configuration in which a word line is selected based on a row address and a bit line is selected based on a column address. There is a case where the word line is hierarchized in a main word line selected by a higher-order bit of the row address and a sub word line selected by a lower-order bit of the row address. There is a case where a main word driver that drives the main word line includes a level shift circuit that converts the amplitude of a pre-decode signal obtained by pre-decoding the higher-order bit of the row address and a main word driver circuit that drives the main word line based on a level-shifted pre-decode signal.

DETAILED DESCRIPTION

Various embodiments of the present disclosure will be explained below in detail with reference to the accompanying drawings. The following detailed description refers to the accompanying drawings that show, by way of illustration, specific aspects, and various embodiments of the present disclosure. The detailed description provides sufficient detail to enable those skilled in the art to practice these embodiments of the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
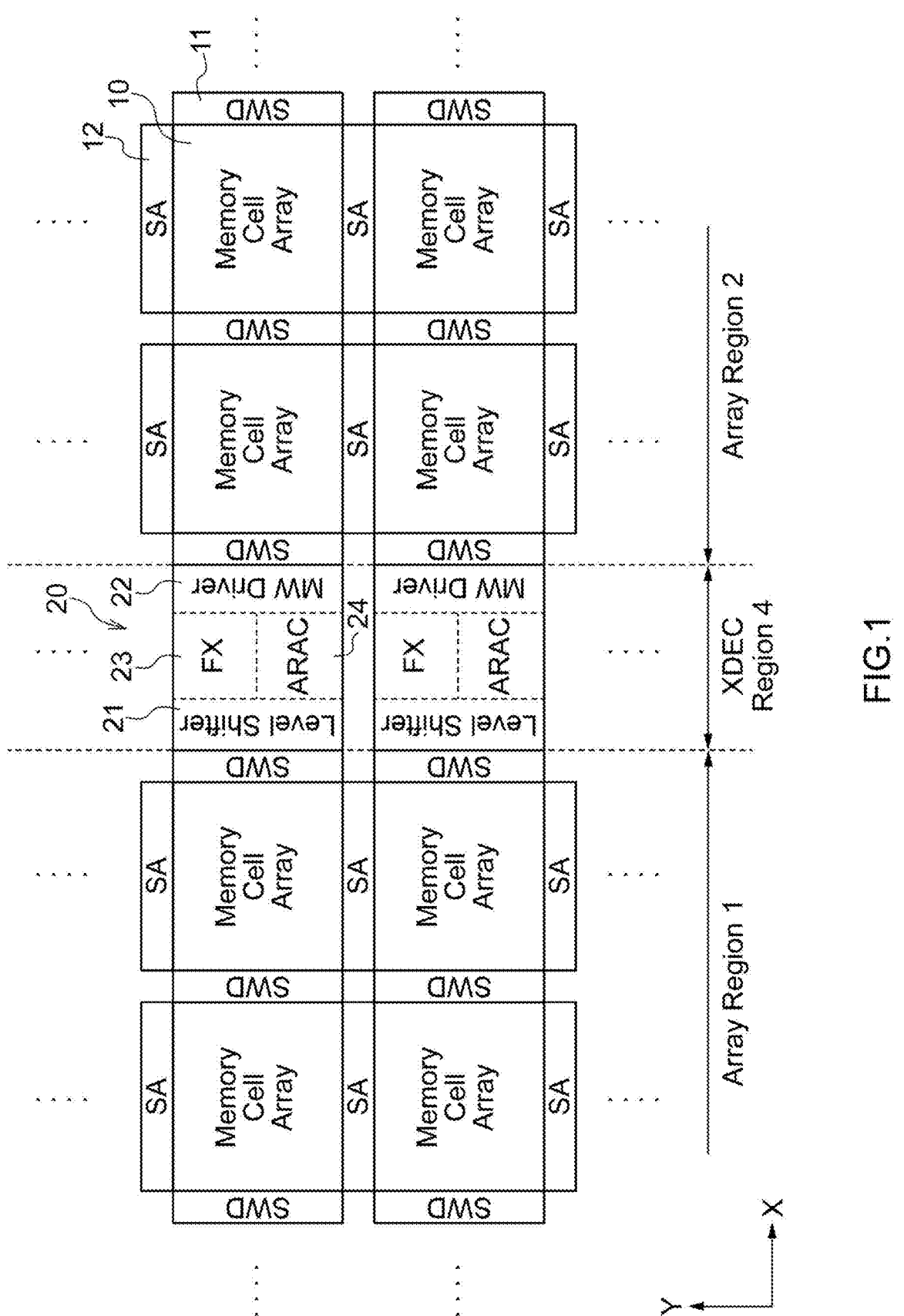
FIG. 1 is a schematic diagram showing a configuration of main parts of a semiconductor memory device according to an embodiment of the present disclosure.

FIG. 1 is a schematic diagram showing a configuration of main parts of a semiconductor memory device according to an embodiment of the present disclosure. The semiconductor memory device shown in FIG. 1 is a DRAM and includes array regions 1 and 2 each including a plurality of memory cell arrays 10 and a row decoder region 4 sandwiched between the array regions 1 and 2 in an X direction. In the array regions 1 and 2, a sub word driver region 11 is provided on each side of the memory cell array 10 in the X direction, and a sense amplifier region 12 is provided on each side of the memory cell array 10 in a Y direction. The row decoder region 4 includes a plurality of unit row decoder regions 20 arranged in the Y direction. The X direction and the Y direction may be perpendicular to each other.

Figure 2:
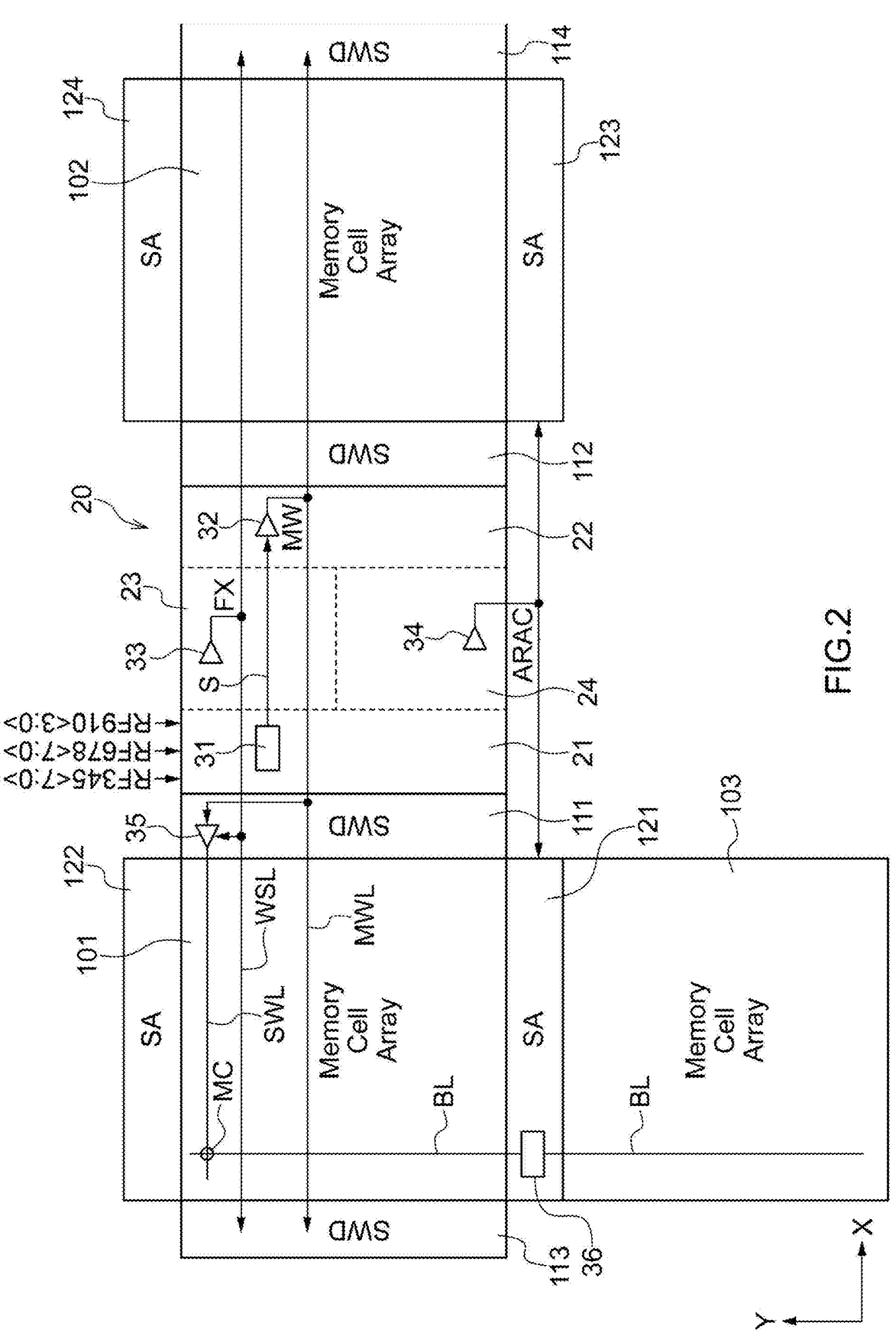
FIG. 2 is a schematic diagram for explaining a configuration of a unit row decoder region in more detail.

FIG. 2 is a schematic diagram for explaining a configuration of the unit row decoder region 20 in more detail. As shown in FIG. 2, the unit row decoder region 20 includes a region 21 where a plurality of level shift circuits 31 are arranged, a region 22 where a plurality of main word driver circuits 32 are arranged, a region 23 where a plurality of word selection circuits 33 are arranged, and a region 24 where a plurality of sense amplifier control circuits 34 are arranged. A pre-decode signal RF345, a pre-decode signal RF678, and a pre-decode signal RF910 are supplied to the level shift circuit 31, where the pre-decode signal RF345 is obtained by pre-decoding address bits X3 to X5 constituting a row address, the pre-decode signal RF678 is obtained by pre-decoding address bits X6 to X8 constituting the row address, and the pre-decode signal RP910 is obtained by pre-decoding address bits X9 and X10 constituting the row address. The level shift circuit 31 controls the main word driver circuit 32 based on these pre-decode signals RF345, RF678, and RF910. The main word driver circuit 32 supplies a main word signal MW to a main word line MWL extending in the X direction. The word selection circuit 33 supplies a sub word selection signal FX to a word selection line WSL extending in the X direction based on other bits of the row address (for example, address bits XO to X2). The sense amplifier control circuit 34 supplies a control signal ARAC to sense amplifier regions 121 and 123 associated therewith.

In the example shown in FIG. 2, a memory cell array 101 is arranged on a −X direction side of the unit row decoder region 20, and a memory cell array 102 is arranged on a +X direction side of the unit row decoder region 20. A memory cell array 103 is arranged on a −Y direction side of the memory cell array 101. Sub word driver regions 111 and 113 are provided on both sides of the memory cell array 101 in the X direction, respectively. Sub word driver regions 112 and 114 are provided on both sides of the memory cell array 102 in the X direction, respectively. The sub word driver region 111 is sandwiched between the memory cell array 101 and the unit row decoder region 20 in the X direction to be adjacent to the region 21. The sub word driver region 112 is sandwiched between the memory cell array 102 and the unit row decoder region 20 in the X direction to be adjacent to the region 22. A plurality of sub word drivers 35 are arranged in the sub word driver regions 111 to 114. The sub word drivers 35 each activate an associated sub word line SWL based on the sub word selection signal FX supplied via the word selection line WSL and the main word line signal MW supplied via the main word line MWL. The sense amplifier regions 121 and 122 are provided on both sides of the memory cell array 101 in the Y direction, respectively. The sense amplifier regions 123 and 124 are provided on both sides of the memory cell array 102 in the Y direction, respectively. A plurality of sense amplifiers 36 are arranged in the sense amplifier regions 121 to 124. Each of the sense amplifiers 36 amplifies a potential difference appearing in a pair of bit lines BL. A memory cell MC is arranged at an intersection of a sub word line SWL and a bit line BL. With this configuration, when data held in the memory cell MC responsive to activation of the sub word line SWL is read by the bit line BL, the data read by the bit line BL is amplified by an associated one of the sense amplifiers 36.

Figure 3:
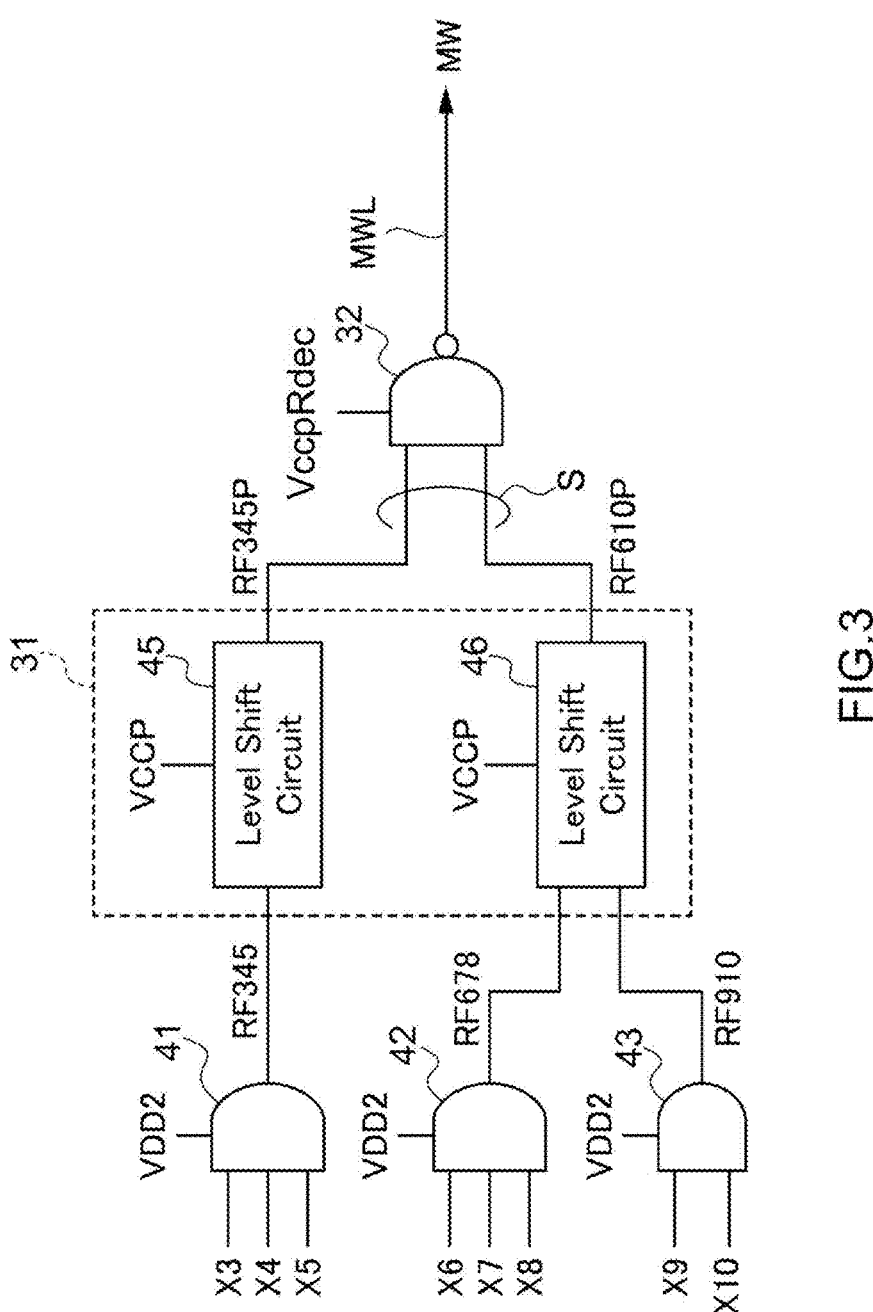
FIG. 3 is a schematic circuit diagram for explaining functions of circuits included in a row decoder region.

FIG. 3 is a schematic circuit diagram for explaining functions of circuits included in a row decoder region. In the example shown in FIG. 3, the address bits X3 to X5 constituting a row address are supplied to a pre-decoder 41. The pre-decoder 41 generates the pre-decode signal RF345 based on the address bits X3 to X5. The pre-decode signal RF345 has, for example, an 8-bit configuration formed of pre-decode bits RF345<0> to RF345<7>, in which any one of the pre-decode bits RF345<0> to RF345<7> is activated. The address bits X6 to X8 constituting the row address are supplied to a pre-decoder 42. The pre-decoder 42 generates the pre-decode signal RF678 based on the address bits X6 to X8. The pre-decode signal RF678 has, for example, an 8-bit configuration formed of pre-decode bits RF678<0> to RF678<7>, in which any one of the pre-decode bits RF678<0> to RF678<7> is activated. The address bits X9 and X10 constituting the row address are supplied to a pre-decoder 43. The pre-decoder 43 generates the pre-decode signal RF910 based on the address bits X9 and X10. The pre-decode signal RF910 has, for example, a 4-bit configuration including pre-decode bits RF910<0> to RF910<3>, in which any one of the pre-decode bits RF910<0> to RF910<3> is activated.

In the example shown in FIG. 3, two level shift circuits 45 and 46 are included in the level shift circuit 31. The pre-decode signal RF345 is converted to a pre-decode signal RF345P by the level shift circuit 45. The pre-decode signals RF678 and RP910 are converted to a pre-decode signal RF610P by the level shift circuit 46. The pre-decode signals RF345P and RF610P are supplied to the main word driver circuit 32 via a signal line S. The main word driver circuit 32 activates an associated main word line MWL based on the pre-decode signal RF345P and the pre-decode signal RF610P. A power potential VCCP of the level shift circuit 31 and a power potential VccpRdec of the main word driver circuit 32 are higher than a power potential VDD2 of the pre-decoders 41 to 43. In some embodiments, the power potential VccpRdec and the power potential VCCP have the same level. The power potential VccpRdec may be independent of the VCCP voltage node. That is, the level shift circuit 31 converts the pre-decode signals RF345, RF678, and RF910 having an amplitude VDD2 to the pre-decode signals RF345P and RF610P having an amplitude VCCP.

Figure 4:
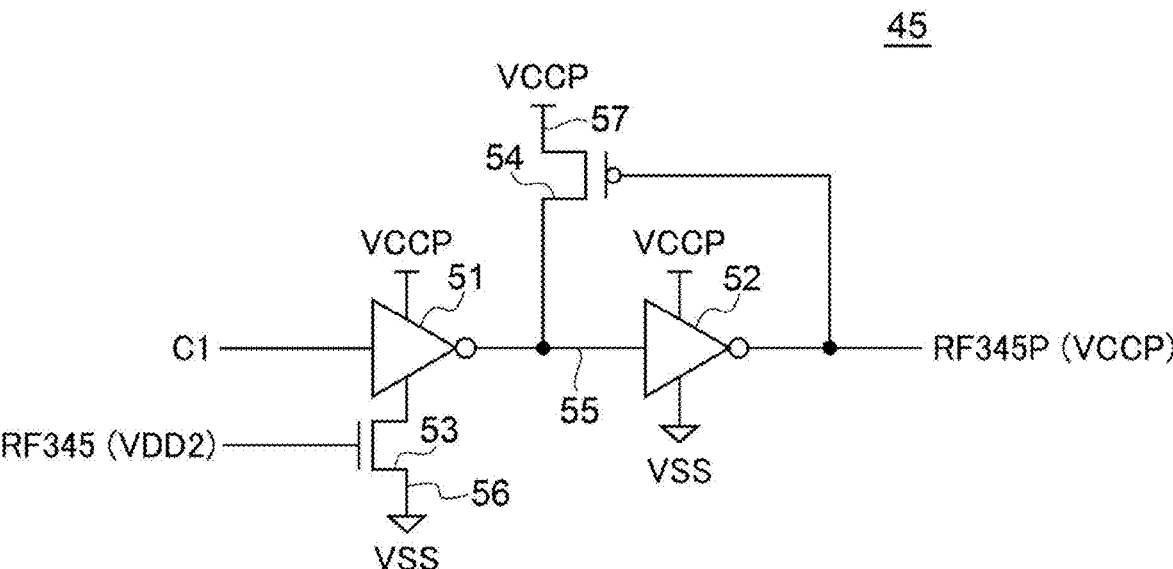
FIGS. 4 and 5 are circuit diagrams of a level shift circuit.

FIG. 4 is a circuit diagram of the level shift circuit 45. As shown in FIG. 4, the level shift circuit 45 includes cascade-coupled inverter circuits 51 and 52, an N-channel MOS transistor 53, and a P-channel MOS transistor 54. A control signal C1 is supplied to an input node of the inverter circuit 51. An output node of the inverter circuit 51 and an input node of the inverter circuit 52 are coupled to each other via a signal line 55. A power potential VCCP is supplied to high-potential side power nodes of the inverter circuits 51 and 52. The transistor 53 is coupled between a low-potential side power node of the inverter circuit 51 and a power line 56 to which a ground potential VSS is supplied. Any of bits (any of RF345<0> to RF345<7>) constituting the pre-decode signal RF345 is supplied to a gate electrode of the transistor 53. With this configuration, the inverter circuit 51 included in each level shift circuit 45 is activated when an associated bit of the pre-decode signal RF345 is at a high level. The transistor 54 is coupled between a power line 57 to which the power potential VCCP is supplied and the signal line 55. A gate electrode of the transistor 54 is coupled to an output node of the inverter circuit 52. From the output node of the inverter circuit 52, an associated bit (any of RF345P<0> to RF345P<7>) of a level-converted pre-decode signal RF345 is output. With this circuit configuration, the pre-decode signal RF345 having an amplitude VDD2 is converted to the pre-decode signal RF345P having an amplitude VCCP in response to the control signal C1.

Figure 5:
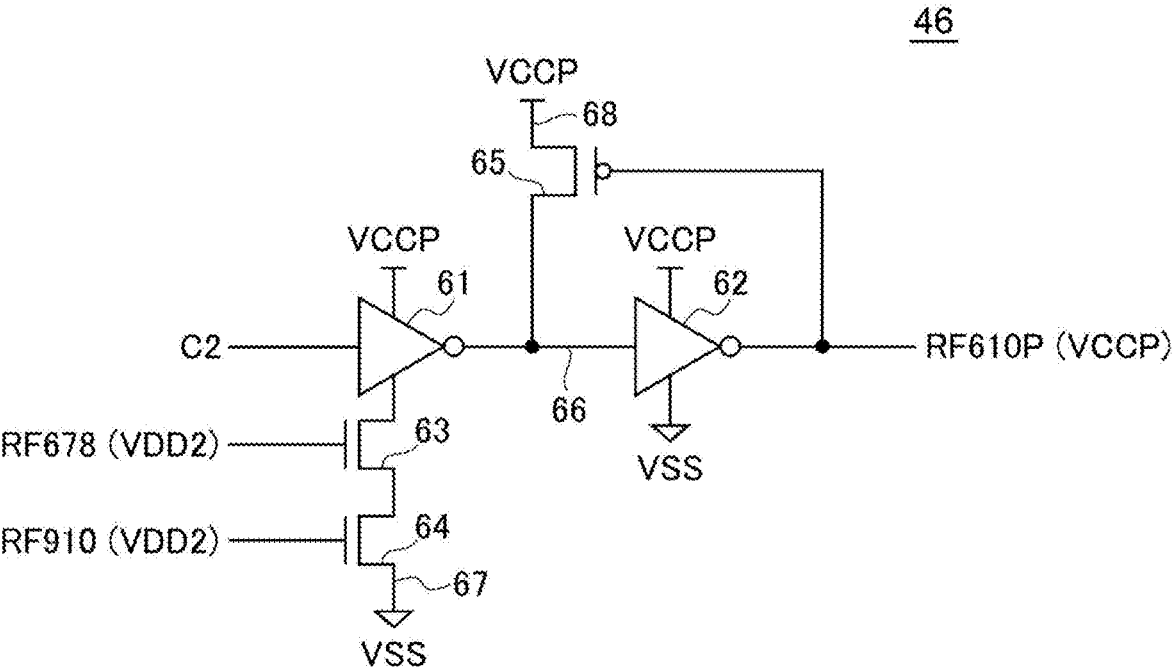

FIG. 5 is a circuit diagram of the level shift circuit 46. As shown in FIG. 5, the level shift circuit 46 includes cascade-coupled inverter circuits 61 and 62, N-channel MOS transistors 63 and 64, and a P-channel MOS transistor 65. A control signal C2 is supplied to an input node of the inverter circuit 61. An output node of the inverter circuit 61 and an input node of the inverter circuit 62 are coupled to each other via a signal line 66. The power potential VCCP is supplied to high-potential side power nodes of the inverter circuits 61 and 62. The transistors 63 and 64 are coupled in series between a low-potential side power node of the inverter circuit 61 and a power line 67 to which the ground potential VSS is supplied. Any of bits (any of RF678<0> to RF678<7>) constituting the pre-decode signal RF678 is supplied to a gate electrode of the transistor 63. Any of bits (any of RF910<0> to RF910<3>) constituting the pre-decode signal RF910 is supplied to a gate electrode of the transistor 64. Therefore, the inverter circuit 61 included in each level shift circuit 46 is activated when both an associated bit of the pre-decode signal RF678 and an associated bit of the pre-decode signal RF910 are at a high level. The transistor 65 is coupled between a power line 68 to which the power potential VCCP is supplied and the signal line 66. A gate electrode of the transistor 65 is coupled to an output node of the inverter circuit 62. From the output node of the inverter circuit 62, an associated bit (for example, any of RF610P<0> to RF610P<24>) of a level-converted pre-decode signal RF610P is output. With this circuit configuration, the pre-decode signals RF678 and RF910 having an amplitude VDD2 is converted to the pre-decode signal RF610P having an amplitude VCCP in response to the control signal C2.

Figure 6:
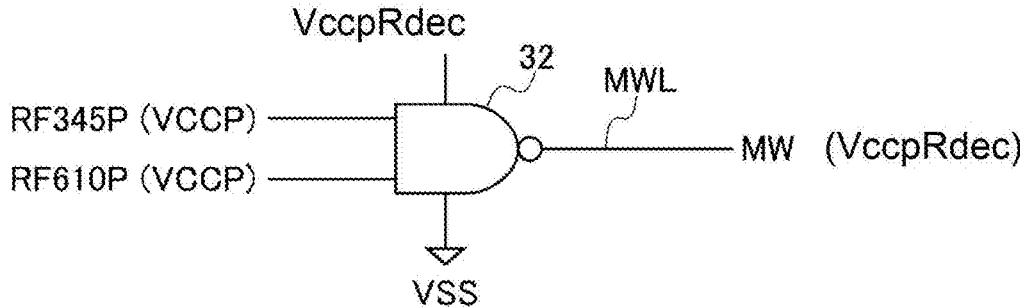
FIG. 6 is a circuit diagram of a main word driver circuit.

FIG. 6 is a circuit diagram of the main word driver circuit 32. As shown in FIG. 6, the main word driver circuit 32 is configured by a NAND gate circuit that receives any of bits constituting the pre-decode signal RF345P and any of bits constituting the pre-decode signal RF610P. The main word signal MW serving as an output of the main word driver circuit 32 is supplied to an associated main word line MWL.

Figure 7:
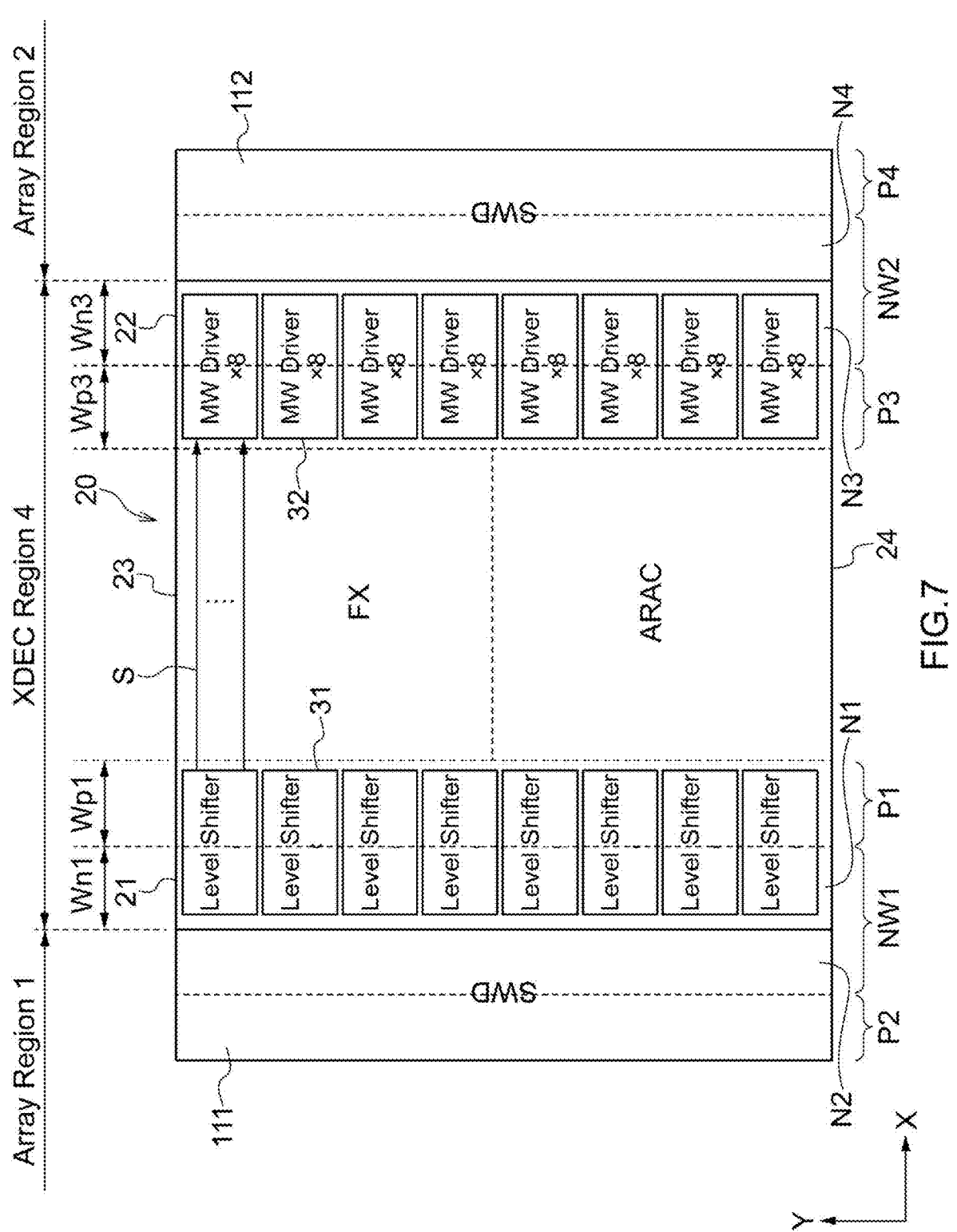
FIG. 7 is a schematic diagram for explaining a configuration of the unit row decoder region and sub word driver regions.

FIG. 7 is a schematic diagram for explaining a configuration of the unit row decoder region 20 and the sub word driver regions 111 and 112. As shown in FIG. 7, N-well regions NW1 and NW2 where a source potential is the power potential VCCP are provided to overlap borders between the array regions 1 and 2 and the row decoder region 4, respectively. The N-well region NW1 includes a region N1 and a region N2 arranged in the X direction. In the region N1, a P-channel MOS transistor constituting the level shift circuit 31 is arranged. In the region N2, a P-channel MOS transistor constituting the sub word driver 35 in the sub word driver region 111 is arranged. Although the border between the region N1 and the region N2 extends in the Y direction, the N-well region NW1 is a single well and there is no physical border such as another well between the region N1 and the region N2. An N-channel MOS transistor constituting the level shift circuit 31 is arranged in a region P1 adjacent to the region N1. An N-channel MOS transistor constituting the sub word driver 35 in the sub word driver region 111 is arranged in a region P2 adjacent to the region N2. The N-well region NW1 is sandwiched between the regions P1 and P2 in the X direction.

Similarly, the N-well region NW2 includes a region N3 and a region N4 arranged in the X direction. A P-channel MOS transistor constituting the main word driver circuit 32 is arranged in the region N3. A P-channel MOS transistor constituting the sub word driver 35 in the sub word driver region 112 is arranged in the region N4. Although the border between the region N3 and the region N4 extends in the Y direction, the N-well region NW2 is a single well and there is no physical border such as another well between the region N3 and the region N4. An N-channel MOS transistor constituting the main word driver circuit 32 is arranged in a region P3 adjacent to the region N2. An N-channel MOS transistor constituting the sub word driver 35 in the sub word driver region 112 is arranged in a region P4 adjacent to the region N4. The N-well region NW2 is sandwiched between the regions P3 and P4 in the X direction.

The regions P1 to P4 are a semiconductor substrate or P-well regions where the source potential thereof is the ground potential VSS. It is permissible that a width Wn1 in the X direction of the region N1 is different from a width Wn3 in the X direction of the region N3. It is permissible that a width Wp1 in the X direction of the region P1 is different from a width Wp3 in the X direction of the region P3. In the region 23 where the word selection circuit 33 is arranged and the region 24 where the bit selection circuit 34 is arranged, a plurality of N-well regions where the source potential thereof is the power potential VDD2 or the like and a semiconductor substrate or a P-well region where the source potential thereof is the ground potential VSS are arranged.

As described above, in the example shown in FIG. 7, the region 21 where the level shift circuit 31 is arranged is positioned at a −X direction side end of the unit row decoder region 20, and the region 22 where the main word driver circuit 32 is arranged is positioned at a +X direction side end of the unit row decoder region 20. Accordingly, the signal line S coupling the level shift circuit 31 and the main word driver circuit 32 to each other extends in the X direction to pass over the region 23 or the region 24. In addition, since the N-type region N1 included in the region 21 and the N-type region N2 included in the sub word driver region 111 are adjacent to each other in the X direction and are integrated with each other, it is not necessary to provide an isolation region or the like between the unit row decoder region 20 and the sub word driver region 111. Similarly, since the N-type region N3 included in the region 22 and the N-type region N4 included in the sub word driver region 112 are adjacent to each other in the X direction and are integrated with each other, it is not necessary to provide an isolation region or the like between the unit row decoder region 20 and the sub word driver region 112. With this configuration, the chip size can be downscaled further.

Figure 8:
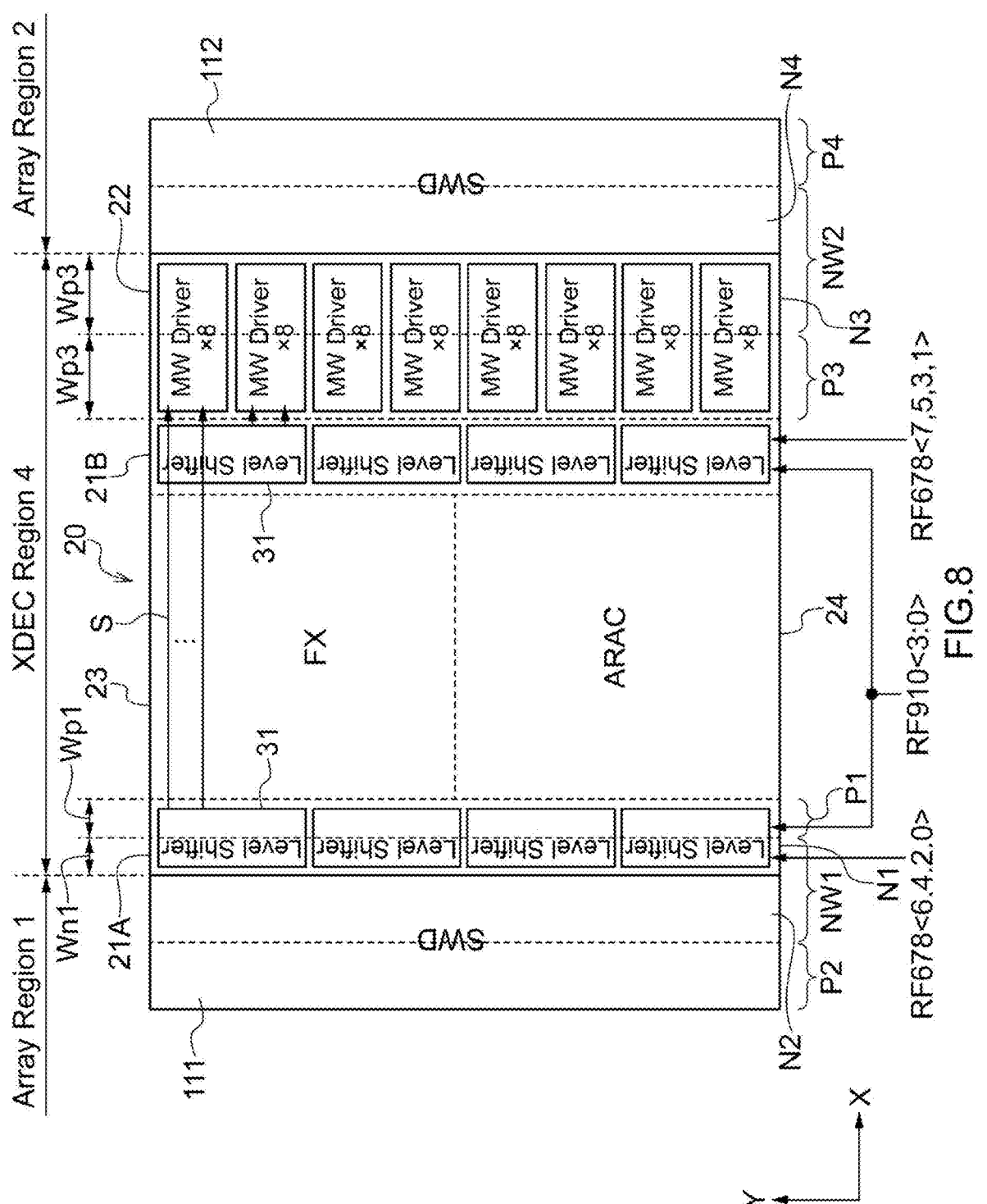
FIG. 8 is a schematic diagram for explaining another configuration of the unit row decoder region and the sub word driver regions.

FIG. 8 is a schematic diagram for explaining another configuration of the unit row decoder region 20 and the sub word driver regions 111 and 112. In the example shown in FIG. 8, the level shift circuit 31 is arranged to be distributed in two regions 21A and 21B. One region 21A is positioned at a −X direction side end of the unit row decoder region 20 and includes the region N1 and the region P1. In the region 21A, a half of a plurality of level shift circuits 31 included in the unit row decoder region 20 are arranged. The other region 21B is positioned between the region 22 and the regions 23 and 24, and the remaining half of the level shift circuits 31 included in the unit row decoder region 20 are arranged in the other region 21B. With this configuration, the width Wn1 in the X direction of the region N1 and the width Wp1 in the X direction of the region P1 are about half that in the example shown in FIG. 7. In FIG. 8, the width Wn1 is smaller than the width Wn3, and the width Wp1 is smaller than the width Wp3. With this configuration, among signal lines S coupling the level shift circuits 31 and the main word driver circuits 32 to each other, the length in the X direction of a signal line S associated with the level shift circuit 31 arranged in the region 21B is shortened. Consequently, the flexibility of wiring design on the regions 23 and 24 is enhanced. Also in this example, the N-type region N1 included in the region 21A and the N-type region N2 included in the sub word driver region 111 are integrated with each other so that, similarly to the example shown in FIG. 7, the chip size can be downscaled further.

Although various embodiments have been disclosed in the context of certain preferred embodiments and examples, it will be understood by those skilled in the art that the scope of the present disclosure extends beyond the specifically disclosed embodiments to other alternative embodiments and/or uses of the embodiments and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying modes of the disclosed embodiments. Thus, it is intended that the scope of at least some of the present disclosure should not be limited by the particular disclosed embodiments described above.

The invention claimed is:

1. An apparatus comprising:
a first memory cell array;
a second memory cell array, the second memory cell array and the first memory cell array being arranged in a first direction;
a plurality of first sub word line drivers and a plurality of second sub word line drivers, a plurality of main word line drivers, and a plurality of level shift circuits each arranged on an intermediate region between the first memory cell array and the second memory cell array,
wherein the plurality of first sub word line drivers are arranged in a second direction perpendicular to the first direction and along the first memory cell array,
wherein the plurality of second sub word line drivers are arranged in the second direction and along the second memory cell array,
wherein the plurality of main word line drivers are arranged in the second direction and adjacently along the plurality of second sub word line drivers, and
wherein the plurality of level shift circuits are arranged in the second direction and adjacently along the plurality of first sub word line drivers, the plurality of level shift circuits being configured to provide voltage-level-shifted signals to the plurality of main word line drivers, respectively.

2. The apparatus of claim 1,
wherein the intermediate region includes a first circuit region on which the plurality of level shift circuits are arranged,
wherein the first circuit region includes a first transistor region of a first conductivity type and a second transistor region of a second conductivity type opposite to the first conductivity type, and wherein the first transistor region and the second transistor region are arranged in the first direction.

3. The apparatus of claim 2,
wherein the intermediate region further includes a first sub word driver region on which the plurality of first sub word line drivers are arranged,
wherein the first sub word driver region includes a third transistor region having the first conductivity type and a fourth transistor region having the second conductivity type, and
wherein the third transistor region and the fourth transistor region are arranged in the first direction.

4. The apparatus of claim 3, wherein the first transistor region and the third transistor region are integrated.

5. The apparatus of claim 4,
wherein the intermediate region includes a second circuit region on which the plurality of main word line drivers are arranged,
wherein the second circuit region includes a fifth transistor region of the first conductivity type and a sixth transistor region of the second conductivity type, and
wherein the fifth transistor region and the sixth transistor region are arranged in the first direction.

6. The apparatus of claim 5,
wherein the intermediate region further includes a second sub word driver region on which the plurality of second sub word line drivers are arranged,
wherein the second sub word driver region includes a seventh transistor region having the first conductivity type and an eighth transistor region having the second conductivity type, and
wherein the seventh transistor region and the eighth transistor region are arranged in the first direction.

7. The apparatus of claim 6, wherein the fifth transistor region and the seventh transistor region are integrated.

8. The apparatus of claim 7, further comprising:
a plurality of word selection circuits each configured to generate an associated one of a plurality of word selection signals; and
a plurality of word selection lines supplied with an associated one of the plurality of word selection signals and extending in the first direction so as to overlap the first and second memory cell arrays,
wherein the intermediate region further includes a third circuit region arranged between the first and second circuit regions in the first direction, and
wherein the plurality of word selection circuits are arranged on the third circuit region.

9. The apparatus of claim 8, further comprising a first signal line supplying one of the voltage-level-shifted signals from one of the plurality of level shift circuits to one of the plurality of main word line drivers,
wherein the first signal line extends in the first direction so as to be across the third circuit region.

10. The apparatus of claim 8, further comprising a sense amplifier region on which a plurality of sense amplifiers are arranged,
wherein the first memory cell array further includes a bit line coupled to an associated one of the plurality of sense amplifiers and a memory cell coupled to a first sub word line and the bit line.

11. The apparatus of claim 10, further comprising a plurality of bit selection circuits configured to control the plurality of sense amplifiers,
wherein the intermediate region further includes a fourth circuit region arranged between the first and second circuit regions in the first direction, and
wherein the plurality of bit selection circuits are arranged on the fourth region.

12. The apparatus of claim 11, wherein the third and fourth regions are arranged in second direction perpendicular to the first direction.

13. The apparatus of claim 11, further comprising a second signal line supplying another one of the voltage-level-shifted signals from another one of the plurality of level shift circuits to one of the plurality of main word line drivers,
wherein the second signal line extends in the first direction so as to be across the fourth circuit region.

14. The apparatus of claim 7, further comprising a plurality of additional level shift circuits arranged between the second circuit region and the third and fourth circuit regions.

* * * * *